(12) United States Patent
Tseng et al.

(10) Patent No.: US 8,386,860 B2
(45) Date of Patent: Feb. 26, 2013

(54) METHODS OF CALCULATING COMPENSATION VOLTAGE AND ADJUSTING THRESHOLD VOLTAGE AND MEMORY APPARATUS AND CONTROLLER

(75) Inventors: Chien-Fu Tseng, Yunlin County (TW); Kuo-Hsin Lai, Hsinchu County (TW); Li-Chun Liang, Kaohsiung (TW)

(73) Assignee: Phison Electronics Corp., Miaoli (TW)

( * ) Notice: Subject to any disclaimer, the term of this patent is extended or adjusted under 35 U.S.C. 154(b) by 342 days.

(21) Appl. No.: 12/788,649

(22) Filed: May 27, 2010

(65) Prior Publication Data

US 2011/0258495 A1    Oct. 20, 2011

(30) Foreign Application Priority Data

Apr. 14, 2010  (TW) ................................ 99111612 A

(51) Int. Cl.
*G11C 29/00* (2006.01)
(52) U.S. Cl. ......................... 714/721; 714/763; 714/727
(58) Field of Classification Search .................. 714/721, 714/704, 763, 727, 738, 731; 369/44.34, 369/44.28
See application file for complete search history.

(56) References Cited

U.S. PATENT DOCUMENTS

| 5,677,899 | A * | 10/1997 | Getreuer | 369/44.28 |
| 6,278,665 | B1 * | 8/2001 | Schell et al. | 369/13.22 |
| 6,317,391 | B1 * | 11/2001 | Schell et al. | 369/13.17 |
| 6,418,097 | B1 * | 7/2002 | Schell et al. | 369/44.34 |

\* cited by examiner

*Primary Examiner* — Fritz Alphonse
(74) *Attorney, Agent, or Firm* — J.C. Patents

(57) ABSTRACT

Methods of calculating a compensation voltage and adjusting a threshold voltage, a memory apparatus, and a controller are provided. In the present invention, data is written into a rewritable non-volatility memory, and the data is then read from the rewritable non-volatility memory and compared with the previously written data to obtain error bit information. The compensation voltage of the threshold voltage is calculated according to the error bit information, and the threshold voltage is adjusted according to the compensation voltage.

23 Claims, 7 Drawing Sheets

METHODS OF CALCULATING COMPENSATION VOLTAGE AND ADJUSTING THRESHOLD VOLTAGE AND MEMORY APPARATUS AND CONTROLLER

CROSS-REFERENCE TO RELATED APPLICATION

This application claims the priority benefit of Taiwan application serial no. 99111612, filed Apr. 14, 2010. The entirety of the above-mentioned patent application is hereby incorporated by reference herein and made a part of specification.

BACKGROUND OF THE INVENTION

1. Field of the Invention

The present invention generally relates to a memory system, and more particularly, to methods of calculating a compensation voltage and adjusting a threshold voltage according to error bit information, a memory apparatus, and a controller.

2. Description of Related Art

Along with the widespread of digital cameras, cell phones, and MP3 in recently years, the consumers' demand to digital storage media has increased drastically. Flash memory is one of the most adaptable storage media to be carried around and used for storing digital files due to its many characteristics such as data non-volatility, low power consumption, small volume, and non-mechanical structure. A solid state drive (SSD) is a storage device which uses a flash memory as its storage medium, and SSD has been broadly applied in computer systems as the master hard disc.

Existing flash memories can be categorized into NOR flash memories and NAND flash memories. The NAND flash memories can be further categorized into multi-level cell (MLC) NAND flash memories and single-level cell (SLC) NAND flash memories according to their different storage modes. In a SLC NAND flash memory, each memory cell stores one bit, while in a MLC NAND flash memory, each memory cell stores two or more bits.

Generally speaking, when data is read from or written into a specific memory cell in a memory cell array constructed with bit lines and word lines, other memory cells will be disturbed and accordingly the writing threshold voltages of these memory cells will be changed. In addition, wear caused by long-time idling, memory electric leakage, or repeated erasing or programming operations may also change the writing threshold voltages of the memory cells. As a result, errors may be produced when previously written data is read.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

Accordingly, the present invention is directed to methods of calculating a compensation voltage and adjusting a threshold voltage, a memory apparatus, and a controller, wherein the compensation voltage is calculated to adjust the threshold voltage so that less error is produced in read data.

The present invention provides a method of adjusting a threshold voltage, and the method is adaptable to a rewritable non-volatile memory. In the present method, data is written into the rewritable non-volatile memory and then read from the same. The read data is compared with the written data to obtain error bit information. A compensation voltage of the threshold voltage is calculated according to the error bit information. The threshold voltage is adjusted according to the compensation voltage. Herein the data is corresponding to one of a plurality of storage states of the rewritable non-volatile memory, and the threshold voltage distinguishes the voltage ranges of two of the storage states.

The present invention also provides a method of calculating a compensation voltage, and the method is adaptable to a rewritable non-volatile memory. The rewritable non-volatile memory has a plurality of word lines, and each of the word lines has a plurality of pages. The rewritable non-volatile memory includes a plurality of storage states. The storage states include at least a first storage state and a second storage state, and the voltage ranges of the first storage state and the second storage state are distinguished by a threshold voltage. When an error bit number of one of the pages exceeds a first predetermined value, a plurality of error bit positions is located in the page. The corresponding data is read from the error bit positions. A first error bit number is obtained by counting the number of the bits that is written in the first storage state and read in the second storage state. A second error bit number is obtained by counting the number of the bits that is written in the second storage state and read in the first storage state. After that, the compensation voltage is calculated according to the first error bit number and the second error bit number.

The present invention further provides a rewritable non-volatile memory apparatus including a rewritable non-volatile memory, a connector, and a memory controller. The connector receives data. The memory controller is coupled to the rewritable non-volatile memory and the connector for executing following steps. The memory controller writes the data into the rewritable non-volatile memory and then reads the data from the same. The memory controller compares the read data with the written data to obtain error bit information. The memory controller calculates a compensation voltage of a threshold voltage according to the error bit information. After that, the memory controller adjusts the threshold voltage according to the compensation voltage. Herein the read data is corresponding to one of a plurality of storage states of the rewritable non-volatile memory, and the threshold voltage distinguishes the voltage ranges of two of the storage states.

The present invention further provides a memory controller for managing a rewritable non-volatile memory. The rewritable non-volatile memory has a plurality of physical blocks, and each of the physical blocks has a plurality of pages, wherein the pages corresponding to the same physical block can be written individually but have to be erased all together. The memory controller includes a memory management circuit, a memory interface, and a host interface. The memory interface is coupled to the memory management circuit and used for coupling to the rewritable non-volatile memory. The host interface is coupled to the memory management circuit and used for receiving data. The memory management circuit executes at least following steps. The memory management circuit writes the data into the rewritable non-volatile memory. The memory management circuit then reads the data from the rewritable non-volatile memory and compares the read data with the written data to obtain error bit information. The memory management circuit calculates a compensation voltage of a threshold voltage according to the error bit information. After that, the memory management circuit adjusts the threshold voltage according to the compensation voltage. Herein the read data is corresponding to one of a plurality of storage states of the rewritable non-volatile memory, and the threshold voltage distinguishes the voltage ranges of two of the storage states.

As described above, in the present invention, a threshold voltage is appropriately compensated to reduce the error bits in read data to a correctable range. Thereby, the lifespan of a rewritable non-volatile memory apparatus is prolonged.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
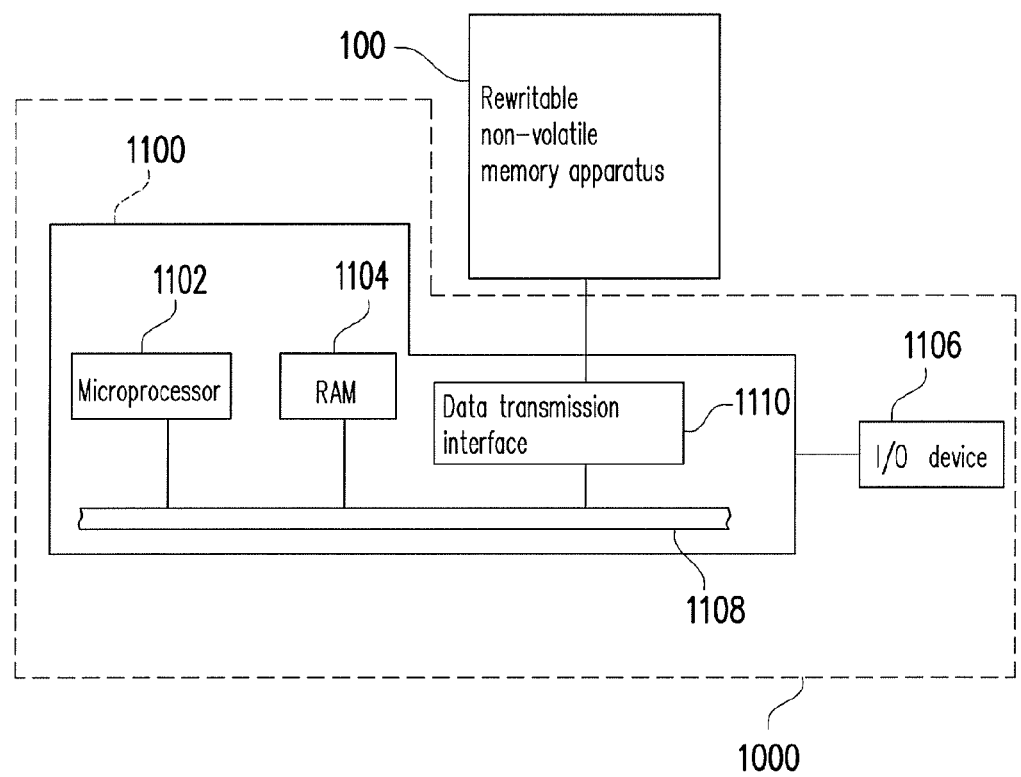
FIG. 1A is a block diagram of a host system using a rewritable non-volatile memory apparatus according to an exemplary embodiment of the present invention.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Reference will now be made in detail to the present preferred embodiments of the invention, examples of which are illustrated in the accompanying drawings. Wherever possible, the same reference numbers are used in the drawings and the description to refer to the same or like parts.

Generally speaking, if a flash memory is worn by long-time idling, memory electric leakage, or repeated erasing or programming operations, the writing threshold voltages of the memory cells will be changed. In this case, errors of read data may be produced if the original threshold voltages are used. Thereby, the present invention provides a method for adjusting threshold voltage, a memory system thereof, and a memory controller thereof, so as to adjust the threshold voltages.

Figure 1B:
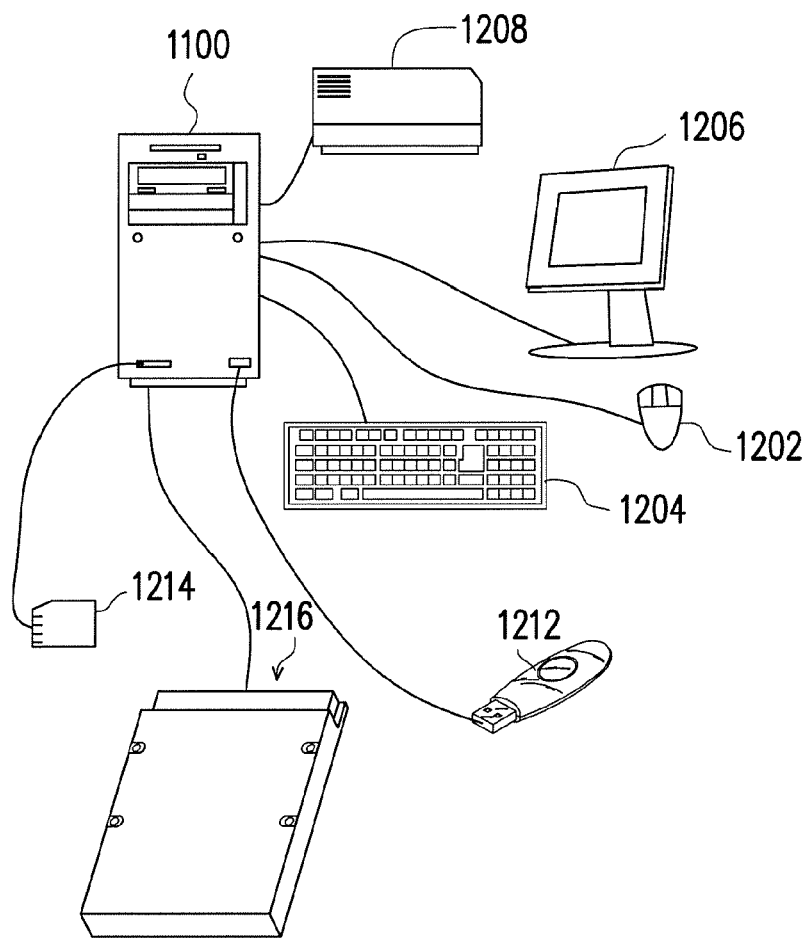
FIG. 1B is a diagram of a computer, an input/output (I/O) device, and a rewritable non-volatile memory apparatus according to an exemplary embodiment of the present invention.
Figure 1C:
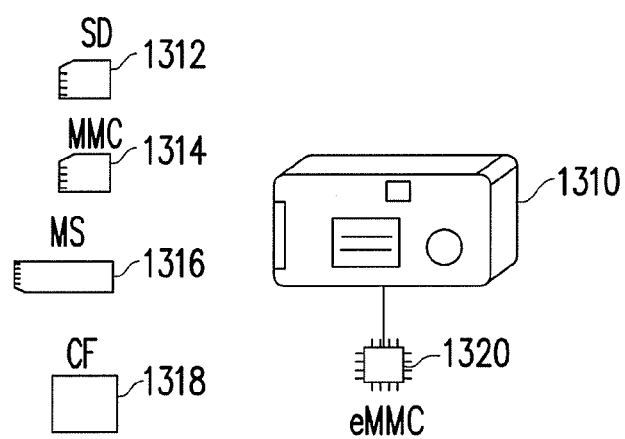
FIG. 1C is a diagram of a host system and a rewritable non-volatile memory apparatus according to another exemplary embodiment of the present invention.

FIG. 1A is a block diagram of a host system using a rewritable non-volatile memory apparatus according to an exemplary embodiment of the present invention. FIG. 1B is a diagram of a computer, an input/output (I/O) device, and a rewritable non-volatile memory apparatus according to an exemplary embodiment of the present invention. FIG. 1C is a diagram of a host system and a rewritable non-volatile memory apparatus according to another exemplary embodiment of the present invention.

Referring to FIG. 1A, the host system 1000 includes a computer 1100 and an I/O device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B and may further include other devices.

In the present exemplary embodiment, a rewritable non-volatile memory apparatus 100 is coupled to other devices of the host system 1000 through the data transmission interface 1110. The host system 1000 writes data into or reads data from the rewritable non-volatile memory apparatus 100 through the operations of the microprocessor 1102, the RAM 1104, and the I/O device 1106. The rewritable non-volatile memory apparatus 100 may be a flash drive 1212, a memory card 1214, or a solid state drive (SSD) 1216, as shown in FIG. 1B.

Generally speaking, the host system 1000 can be substantially any system that can store data. Even though the host system 1000 is described as a computer system in the present exemplary embodiment, in another exemplary embodiment of the present invention, the host system 1000 may also be a digital camera, a video camera, a communication device, an audio player, or a video player, etc. For example, if the host system 1000 is a digital camera (a video camera) 1310, the rewritable non-volatile memory apparatus 100 is then a secure digital (SD) card 1312, a multi media card (MMC) 1314, a compact flash (CF) card 1318, a memory stick (MS) 1316, or an embedded storage device 1320 (as shown in FIG. 1C) used in the host system 1000. Herein the embedded storage device 1320 includes an embedded MMC (eMMC). It should be mentioned that the eMMC is directly coupled to the substrate of the host system 1000.

Figure 2A:
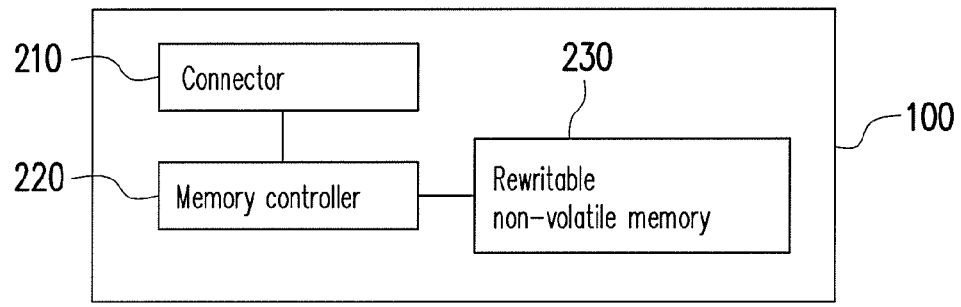
FIG. 2A is a block diagram of a rewritable non-volatile memory apparatus according to an exemplary embodiment of the present invention.

FIG. 2A is a block diagram of a rewritable non-volatile memory apparatus according to an exemplary embodiment of the present invention. Referring to FIG. 2A, the rewritable non-volatile memory apparatus 100 includes a connector 210, a memory controller 220, and a rewritable non-volatile memory 230. The memory controller 220 is coupled to the rewritable non-volatile memory 230 and the connector 210.

Herein the connector 210 may be a SD connector. However, the present invention is not limited thereto, and the connector 210 may also be a serial advanced technology attachment (SATA) connector, a universal serial bus (USB) connector, an Institute of Electrical and Electronic Engineers (IEEE) 1394 connector, a peripheral component interconnect (PCI) express connector, a MS connector, a MMC connector, a CF connector, an integrated device electronics (IDE) connector, or other suitable data transmission connectors.

The rewritable non-volatile memory 230 may be a multi level cell (MLC) NAND flash memory. However, the present invention is not limited thereto, and in another exemplary embodiment of the present invention, the rewritable non-volatile memory 230 may also be a single level cell (SLC) NAND flash memory.

To be specific, the rewritable non-volatile memory 230 has a plurality of word lines, and each of the word lines has a plurality of pages. For example, in the present exemplary embodiment, the rewritable non-volatile memory 230 is a MLC NAND flash memory, and each physical block of the MLC NAND flash memory is programmed in multiple phases. Taking a 2-level cell NAND flash memory as an example, the programming of each physical block thereof is carried out in two phases. During the first phase, data is written into the lower pages, and the physical characteristic thereof is similar to that of a SLC NAND flash memory. After the first phase is completed, the upper pages are programmed, wherein the write speed of the lower pages is faster than that of the upper pages. Thus, the pages in each physical block can be categorized into slow pages (i.e., the upper pages) and fast pages (i.e., the lower pages).

Generally speaking, the rewritable non-volatile memory 230 includes a plurality of storage states and has at least one threshold voltage for distinguishing the voltage ranges of these storage states. Assuming that the rewritable non-volatile memory 230 is a non-volatile memory (NVM) chip, the NVM chip is composed of a memory cell array and a programming and reading voltage control circuit. Data is written into the NVM chip by changing the threshold voltages of memory cells with a high control voltage, and data is read from the NVM chip by distinguishing the voltage ranges of the memory cells with threshold voltages. In actual applications, the rewritable non-volatile memory 230 includes a plurality of memory cell arrays and a plurality of voltage control circuits. The voltage levels at the read control gates of these voltage control circuits can be changed by setting threshold voltages in these voltage control circuits.

As to a SLC, two voltage ranges need to be distinguished by the threshold voltage of the memory cell. Thus, at least one threshold voltage is adopted for distinguishing the two storage states. The two voltage ranges represent two storage states (i.e., the storage state "0" and the storage state "1"). If the voltage of the memory cell is lower than the threshold voltage, the memory cell is turned on, namely, data "1" is stored in the memory cell. Otherwise, if the voltage of the memory cell is not lower than the threshold voltage, the memory cell is not turned on, namely, data "0" is stored in the memory cell.

Additionally, a MLC uses multiple-level threshold voltage for representing multi bits. If each memory cell of the rewritable non-volatile memory 230 stores 2-bit (4 levels), the storage states thereof include "00", "01", "10", and "11", and the memory cell has three threshold voltages. If each memory cell of the rewritable non-volatile memory 230 stores 3-bit (8 levels), the storage states include "000", "001", "010", "011", "100", "101", "110", and "111", and the memory cell has at least seven threshold voltages for distinguishing the storage states corresponding to the eight levels.

The memory controller 220 executes various steps of a method for adjusting threshold voltage. The memory controller 220 writes data into the rewritable non-volatile memory 230. The memory controller 220 reads the data from the rewritable non-volatile memory 230 and compares the read data with the written data to obtain an error bit information. The memory controller 220 calculates a compensation voltage of the threshold voltage according to the error bit information so as to adjust the threshold voltage according to the compensation voltage. Herein the read data is corresponding to one of the storage states of the rewritable non-volatile memory, and the threshold voltage is used for distinguishing the voltage ranges of two of the storage states.

Figure 2B:
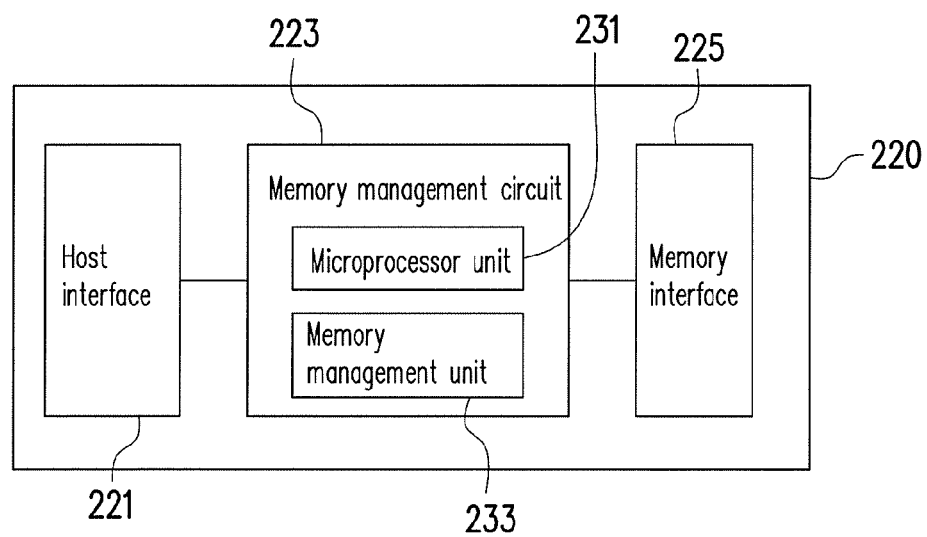
FIG. 2B and FIG. 2C are block diagrams of a memory controller according to an exemplary embodiment of the present invention.
Figure 2C:
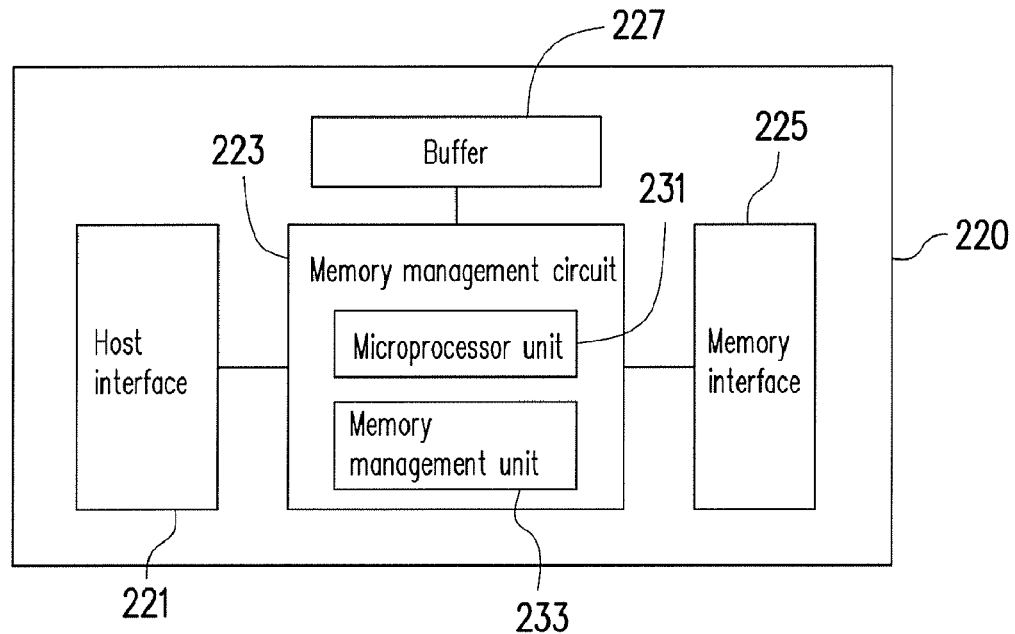

FIG. 2B and FIG. 2C are block diagrams of a memory controller according to an exemplary embodiment of the present invention. Referring to FIG. 2B, the memory controller 220 includes a host interface 221, a memory management circuit 223, and a memory interface 225.

In FIG. 2B, the host interface 221 is used for receiving and identifying a command from the host system 1000. In the present exemplary embodiment, the host interface 221 is a SD interface. However, the present invention is not limited thereto, and the host interface 221 may also be a SATA interface, a USB interface, an IEEE 1394 interface, a PCI express interface, a MS interface, a MMC interface, a CF interface, an IDE interface, or other suitable data transmission interfaces.

The memory interface 225 is used for accessing the rewritable non-volatile memory 230. Namely, data to be written into the rewritable non-volatile memory 230 is converted by the memory interface 225 into a format acceptable to the rewritable non-volatile memory 230.

The memory management circuit 223 executes a method for adjusting threshold voltage and a method for calculating compensation voltage according to the present exemplary embodiment. In the present exemplary embodiment, the memory management circuit 223 includes a microprocessor unit 231 and a memory management unit 233. The memory management unit 233 is implemented in the memory controller 220 as a firmware. For example, the memory management unit 233 including a plurality of program instructions is burnt into a program memory (for example, a read only memory (ROM)), and the program memory is embedded into the memory controller 220. When the rewritable non-volatile memory apparatus 100 is in operation, the memory management circuit 223 executes the program instructions of the memory management unit 233 through the microprocessor unit 231 so as to accomplish the method for adjusting threshold voltage and the method for calculating compensation voltage according to the exemplary embodiments of the present invention.

Figure 2D:
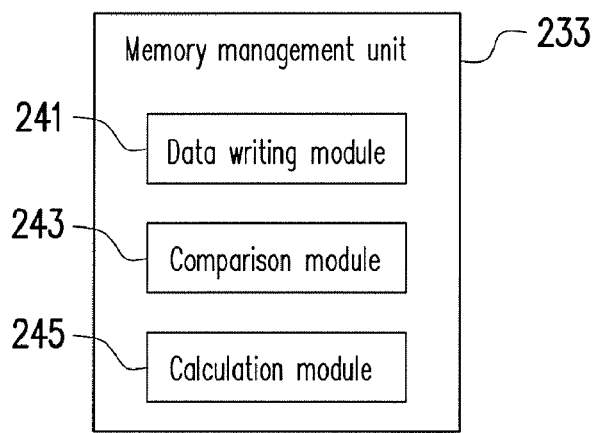
FIG. 2D is a block diagram of a memory management unit according to an exemplary embodiment of the present invention.

FIG. 2D is a block diagram of a memory management unit according to an exemplary embodiment of the present invention. Referring to FIG. 2D, the memory management unit 233 includes a data writing module 241, a comparison module 243, and a calculation module 245. The data writing module 241 writes data into the rewritable non-volatile memory 230. The comparison module 243 reads the data from the rewritable non-volatile memory 230 and compares the read data with the data previously written by the data writing module 241, so as to determine whether any error bit is produced and obtain an error bit information. Herein the error bit information contains an error bit number and an error bit mode (for example, the storage state of the read data changes from "0" to "1" or from "1" to "0"). The calculation module 245 calculates the compensation voltage of the threshold voltage according to the error bit information, so as to adjust the threshold voltage according to the compensation voltage.

In another exemplary embodiment of the present invention, the control instructions of the memory management circuit 223 may also be stored in a specific area (for example, a system area in a flash memory exclusively used for storing system data) of the rewritable non-volatile memory 230 as program codes. Similarly, the control instructions of the memory management circuit 223 are executed by the microprocessor unit 231 when the rewritable non-volatile memory apparatus 100 is in operation. In yet another exemplary embodiment of the present invention, the memory management circuit 223 may also be implemented in the memory controller 220 as a hardware.

Additionally, the memory controller 220 further includes a buffer 227. As shown in FIG. 2C, the buffer 227 is coupled to the memory management circuit 223 for temporarily storing data and commands received from the host system 1000 or data received from the rewritable non-volatile memory 230.

Below, various steps of the method for adjusting threshold voltage will be described in detail with reference to the rewritable non-volatile memory apparatus 100 described above.

Figure 3:
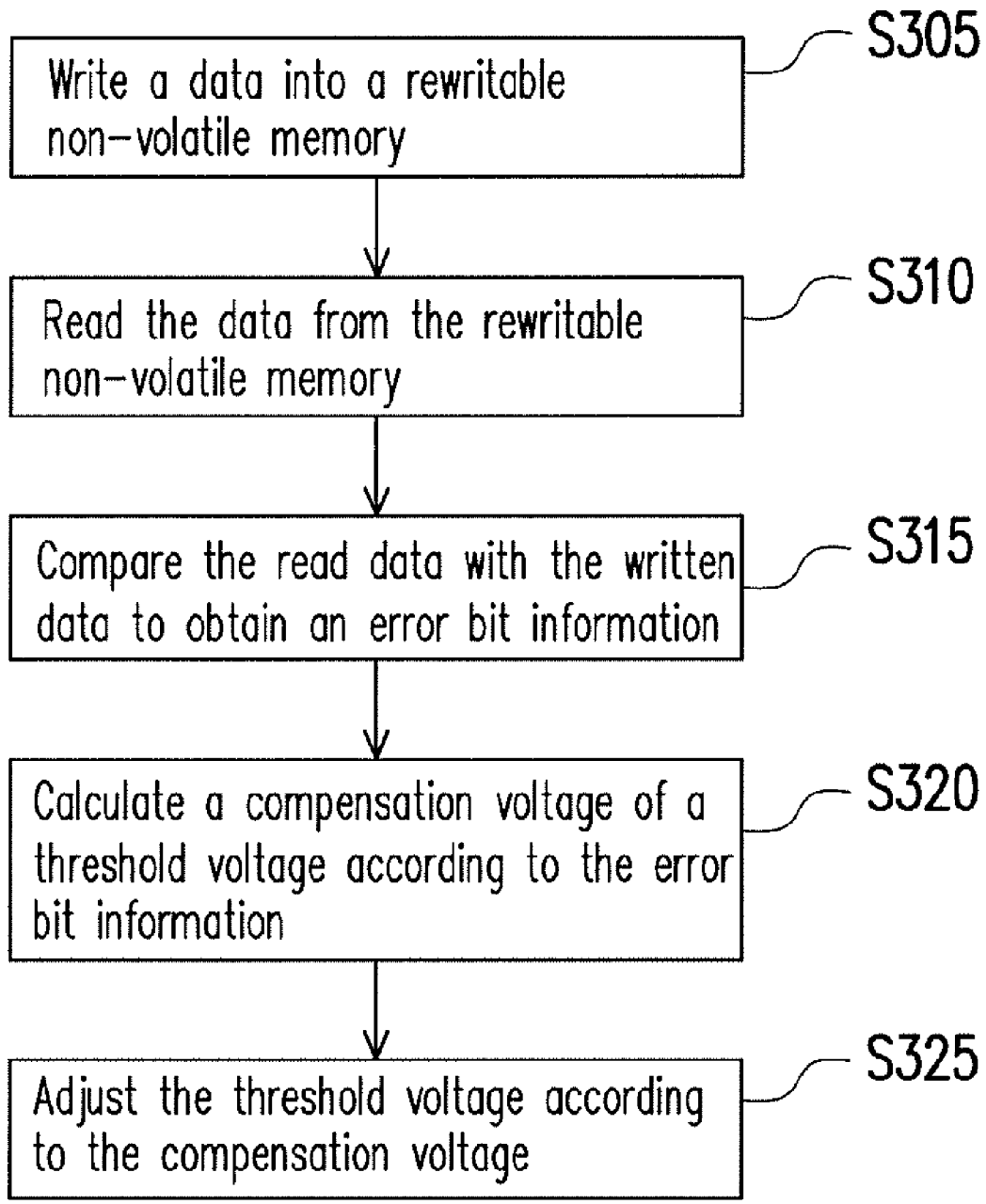
FIG. 3 is a flowchart of a method for adjusting threshold voltage according to an exemplary embodiment of the present invention.

FIG. 3 is a flowchart of a method for adjusting threshold voltage according to an exemplary embodiment of the present invention.

Referring to FIG. 3, in step S305, the memory controller 220 writes data into the rewritable non-volatile memory 230. Then, in step S310, the memory controller 220 reads the data from the rewritable non-volatile memory 230. Herein the data is corresponding to one of the storage states of the rewritable non-volatile memory 230, and the voltage ranges of two storage states are distinguished by a threshold voltage.

In the present exemplary embodiment, the memory controller 220 starts to execute the method for adjusting threshold voltage when it detects an uncorrectable error in the rewritable non-volatile memory 230. For example, the memory controller 220 executes an error correction procedure by using an error checking and correcting (ECC) code to obtain an error bit number. The memory controller 220 determines that an uncorrectable error is produced in the rewritable non-volatile memory 230 when the error bit number exceeds a first predetermined value. In the present exemplary embodiment, the memory controller 220 is capable of correcting 68 error bits, and the first predetermined value may be smaller than the error correction capability of the memory controller 220, such as 60 bits. In addition, the first predetermined value may also be equal to the error correction capability of the memory controller 220, such as 68 bits.

In the present exemplary embodiment, the memory controller 220 determines the data used for testing according to the storage state of the rewritable non-volatile memory 230. Namely, the memory controller 220 writes the data into the rewritable non-volatile memory 230 and then reads it from the same to compare it with the written data, so as to adjust the threshold voltage. In other exemplary embodiments, general data may be written for adjusting the threshold voltage. Namely, when the memory controller 220 writes data into the rewritable non-volatile memory 230, it records the written data. When subsequently the memory controller 220 reads the data from the rewritable non-volatile memory 230, it compares the read data with the previously written data.

Thereafter, in step S315, the memory controller 220 respectively compares each read data with the corresponding written data to obtain the error bit information. For example, when the memory controller 220 writes data into the rewritable non-volatile memory 230, it records the written data. After that, the memory controller 220 compares the data it reads from the rewritable non-volatile memory 230 with the previously recorded data, so as to obtain the error bit information. Herein the error bit information contains an error bit number and an error bit mode (for example, the storage state of the read data changes from 0 to 1 or from 1 to 0 when each memory cell only stores one bit).

After the error bit information is obtained, in step S320, the memory controller 220 calculates a compensation voltage of the threshold voltage according to the error bit information. In step S325, the memory controller 220 adjusts the threshold voltage according to the compensation voltage.

Aforementioned written data contains multi bits. Taking a first storage state and a second storage state having adjacent voltage ranges as an example, the memory controller 220 obtains a first error bit number by counting the number of the bits that is written in the first storage state and read in the second storage state. Besides, the memory controller 220 obtains a second error bit number by counting the number of the bits that is written in the second storage state and read in the first storage state. Herein the voltage range of the first storage state is smaller than that of the second storage state, and the memory controller 220 calculates the compensation voltage based on following formula:

$$x = g \times \log_2\left(\frac{\text{error2}}{\text{error1}}\right).$$

In foregoing formula, x represents the compensation voltage, g is a constant, error2 represents the second error bit number, and error1 represents the first error bit number.

After the compensation voltage x is calculated, the compensation voltage is added to the threshold voltage to obtain the adjusted threshold voltage.

Assuming that each memory cell of the rewritable non-volatile memory 230 stores two bits, when the error bit number of a page exceeds the first predetermined value or the error correction capability of the memory controller 220, the memory controller 220 first determines whether the page is a fast page or a slow page. If the page is a fast page, the memory controller 220 reads the data from the fast pages and compares the data with the original data to obtain error bit positions. Then, the memory controller 220 reads the corresponding data from the error bit positions. The memory controller 220 determines the error bit mode according to the data. For example, the data is written in the first storage state and read in the second storage state, or the data is written in the second storage state and read in the first storage state (the voltage ranges of the first storage state and the second storage state are next to each other). Accordingly, in the fast page, the memory controller 220 obtains the first error bit number by counting the number of the bits that is in the first storage state but determined to be in the second storage state and obtains the second error bit number by counting the number of the bits that is in the second storage state but determined to be in the first storage state. On the other hand, if the page is a slow page, the memory controller 220 reads the data corresponding to the slow page from the error bit positions of the slow page. Besides, the memory controller 220 reads the data corresponding to the fast page according to the error bit positions of the slow page. Accordingly, the memory controller 220 calculates the first error bit number and the second error bit number of the slow page according to foregoing data.

In the present exemplary embodiment, after the error bit information is obtained, the memory controller 220 further determines whether the error bit number in the error bit information is greater than a second predetermined value and only executes the step of calculating the compensation value when the error bit number is greater than the second predetermined value, so as to increase the reliability of the calculation.

Figure 4:
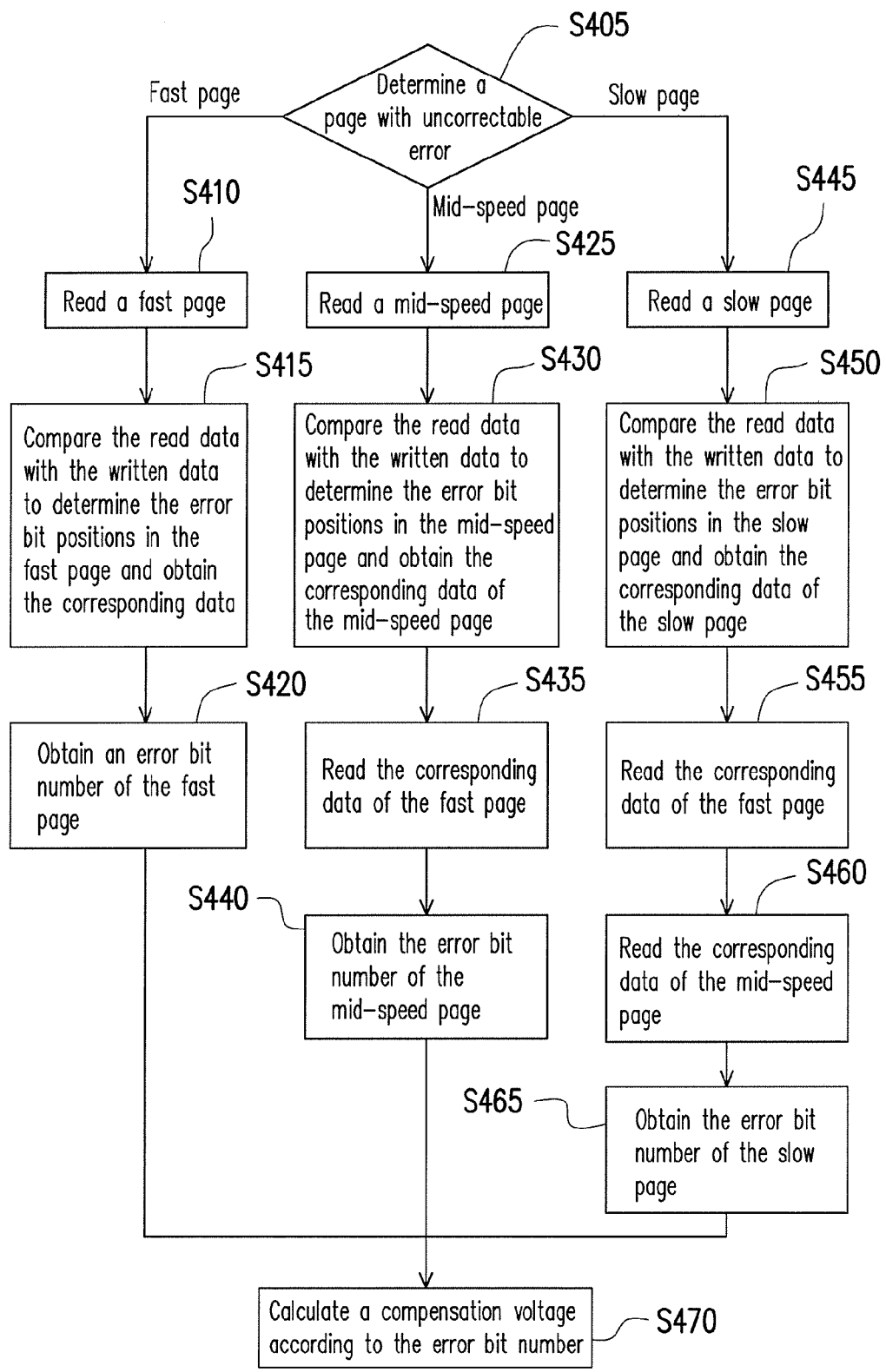
FIG. 4 is a flowchart of a method for calculating compensation voltage according to an exemplary embodiment of the present invention.

FIG. 4 is a flowchart of a method for calculating compensation voltage according to an exemplary embodiment of the present invention. Referring to FIG. 4, in the present exemplary embodiment, it is assumed that each memory cell in the rewritable non-volatile memory 230 stores 3 bits, and the pages of the rewritable non-volatile memory 230 include fast pages, mid-speed pages, and slow pages. In a 3-level memory cell, the fast page is the page having the highest write speed, the mid-speed page is the page having the second highest write speed, and the slow page is the page having the lowest write speed.

In step S405, the memory controller 220 determines whether the page having the uncorrectable error is a fast page, a mid-speed page, or a slow page. The memory controller 220 can adjust the threshold voltage respectively with respect to a fast page, a mid-speed page, or a slow page.

In the present exemplary embodiment, the memory controller 220 finds an empty word line around the word line that produces the uncorrectable error (for example, the error bit number exceeds the first predetermined value, and the first predetermined value is equal to or smaller than the error correction capability of the memory controller 220) to carry out the test. Namely, the memory controller 220 writes data into the empty word line, and the memory controller 220 then reads the data from this word line and compares it with the written data so as to obtain the error bit information.

Herein, every time the memory controller 220 only writes data into one word line. As described above, the previously written data may also be directly read and compared (the previously written data is recorded) so that it is not needed to look for the empty word line for writing data.

Figure 5:
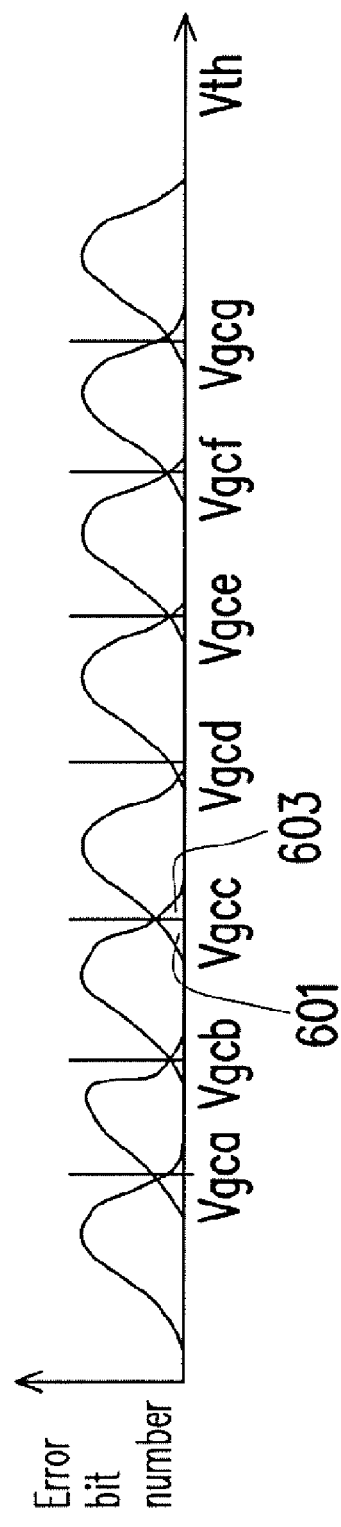
FIG. 5 is a diagram illustrating the error bit numbers corresponding to the storage states of a 3-level memory cell according to an exemplary embodiment of the present invention.

For the convenience of description, the present invention will be further described with reference to an error bit number statistical diagram. FIG. 5 is a diagram illustrating the error bit numbers corresponding to the storage states of a 3-level memory cell according to an exemplary embodiment of the present invention. Referring to FIG. 5, in the present exemplary embodiment, each storage state includes a least significant bit (LSB), a center significant bit (CSB), and a most significant bit (MSB). The LSB is correspondingly written into the fast page, the CSB is correspondingly written into the mid-speed page, and the MSB is correspondingly written into the slow page. The 3-level memory cell has a threshold voltage $V_{gca}$, a threshold voltage $V_{gcb}$, a threshold voltage $V_{gcc}$, a threshold voltage $V_{gcd}$, a threshold voltage $V_{gce}$, a threshold voltage $V_{gcf}$, and a threshold voltage $V_{gcg}$ for distinguishing eight different storage states.

Namely, if the input voltage is higher than the threshold voltage $V_{gca}$ and lower than the threshold voltage $V_{gcb}$, the storage state is "110", and if the input voltage is lower than the threshold voltage $V_{gca}$, the storage state is "111". Namely, the threshold voltage $V_{gca}$ distinguishes the storage state "110" and the storage state "111", and the functions of other threshold voltages can be understood accordingly.

In FIG. 5, the storage state "100" (the first storage state) and the storage state "101" (the second storage state) are taken as examples, and the threshold voltage $V_{gcc}$ distinguishes these two storage states. The block 601 represents the number (a second error bit number) of error bits that are in the storage state "101" but misjudged as in the storage state "100", and the block 603 represents the number (a first error bit number) of error bits that are in the storage state "100" but misjudged as in the storage state "101". The memory controller 220 calculates the compensation voltage x of the threshold voltage Vgcc through foregoing formula and adds the compensation voltage x to the threshold voltage Vgcc so that the block 601 and the block 603 can be approximately equal after the adjustment.

Herein the memory controller 220 may adjust the threshold voltage only in one of the pages of a word line, and each page may respectively have a corresponding threshold voltage. Regarding a 3-level memory cell, each storage state thereof includes a LSB, a CSB, and a MSB, wherein the LSB is correspondingly written into the fast page, the CSB is correspondingly written into the mid-speed page, and the MSB is correspondingly written into the slow page.

Referring to FIG. 4 again, if the memory controller 220 determines the page having the uncorrectable error to be a fast page, in step S410, the memory controller 220 reads the fast page. Then, in step S415, the memory controller 220 compares the read data with the written data to determine the error bit positions in the fast page and obtain the corresponding data. After that, in step S420, the memory controller 220 obtains the error bit number of the fast pages according to foregoing data (1 bit).

For example, as shown in FIG. 5, when the memory controller 220 determines that an uncorrectable error is produced in the fast page, the memory controller 220 reads the LSB of the data recorded in the fast page and compares it with the LSB of the written data so as to determine whether the LSB of the data is changed from "0" to "1" or from "1" to "0" after it is written into the rewritable non-volatile memory 230 and then read from the same. Accordingly, the memory controller 220 counts the number of error bits that change from "0" to "1" and the number of error bits that change from "1" to "0".

Referring to FIG. 4 again, if the memory controller 220 determines the page having the uncorrectable error to be a mid-speed page, in step S425, the memory controller 220 reads the mid-speed page. Then, in step S430, the memory controller 220 compares the read data with the written data to determine the error bit positions in the mid-speed page and obtain the data corresponding to error bit positions of the mid-speed page. Thereafter, in step S435, the memory controller 220 reads the corresponding data in the fast page according to the error bit positions of the fast page. After that, in step S440, the memory controller 220 obtains the error bit number of the mid-speed page according to foregoing data (2 bits).

For example, as shown in FIG. 5, when the memory controller 220 determines that an uncorrectable error is produced in the mid-speed page, the memory controller 220 reads the CSB of the data recorded in the mid-speed page and compares it with the CSB of the written data to locate the error bit positions (i.e., the positions of the CSB in the written data that is changed from "0" to "1" or from "1" to "0" after it is written into the rewritable non-volatile memory 230 and then read from the same). Thereafter, the memory controller 220 reads the data recorded in the fast page corresponding to the error bit positions in the mid-speed page, so as to obtain the number of error bits with changed storage states in the mid-speed page. For example, the number of error bits that change from the storage state "11" to the storage state "10" and the number of error bits that change from the storage state "10" to the storage state "11" are counted. Or, the number of error bits that change from the storage state "00" to the storage state "01" and the number of error bits that change from the storage state "01" to the storage state "00" are counted.

Referring to FIG. 4 again, if the memory controller 220 determines the page having the uncorrectable error to be a slow page, in step S445, the memory controller 220 reads the slow page. Then, in step S450, the memory controller 220 compares the read data with the written data to determine the error bit positions in the slow page and obtain the corresponding data of the slow page. Next, in step S455, the memory controller 220 reads the corresponding data of the fast page according to the error bit positions of the slow page. Besides, in step S460, the memory controller 220 reads the corresponding data in the mid-speed page according to the error bit positions of the slow page. Thereafter, in step S465, the memory controller 220 obtains the error bit number of the slow page according to foregoing data (3 bits).

Referring to FIG. 5, when the memory controller 220 determines that the uncorrectable error is produced in the slow page, it reads the MSB of the data recorded in the slow page and compares it with the MSB of the written data so as to locate the error bit positions. Then, the memory controller 220 reads the data recorded in the fast page corresponding to the error bit positions of the slow page and the data recorded in the mid-speed page corresponding to the error bit positions of the slow page so as to obtain the error bit numbers. For example, the number of error bits that change from the storage state "111" to the storage state "110" and the number of error bits that change from the storage state "110" to the storage state "111" are obtained to adjust the threshold voltage $V_{gca}$. The number of error bits that change from the storage state "100" to the storage state "101" and the number of error bits that change from the storage state "101" to the storage state "100" are obtained to adjust the threshold voltage $V_{gcc}$. The number of error bits that change from the storage state "001" to the storage state "000" and the number of error bits that change from the storage state "000" to the storage state "001" are obtained to adjust the threshold voltage $V_{gce}$. Or, the number of error bits that change from the storage state "010" to the storage state "011" and the number of error bits that change from the storage state "011" to the storage state "010" are obtained to adjust the threshold voltage $V_{gcg}$.

Referring to FIG. 4, after the error bit numbers are obtained (after steps S420, S440, and S465), in step S470, the memory controller 220 calculates the compensation voltage according to the error bit numbers. Additionally, in order to increase the reliability of the compensation voltage, after the error bit numbers are obtained (after the steps S420, S440, and S465), the memory controller 220 only executes the step S470 when the error bit number is greater than a second predetermined value. For example, the memory controller 220 sets the second predetermined value corresponding to the fast page to 20 bits, the second predetermined value corresponding to the mid-speed page to 40 bits, and the second predetermined value corresponding to the slow page to 60 bits. However, the present invention is not limited thereto. The memory controller 220 determines whether the error bit number is greater than the corresponding second predetermined value and starts to execute the steps of the method for calculating compensation voltage when the error bit number exceeds the second predetermined value.

Because the fast page is the first one to be written, when the uncorrectable error is produced in the fast page, the memory controller 220 simply reads the data recorded in the fast page to calculate the error bit number. The mid-speed page is the second one to be written, and when the uncorrectable error is produced in the mid-speed page, the memory controller 220 reads the data recorded in both the fast page and the mid-speed page to calculate the error bit number. The slow page is the last one to be written, and when the uncorrectable error is produced in the slow page, the memory controller 220 reads the data recorded in the fast page, the mid-speed page, and the slow page to calculate the error bit number.

Thereby, the adjustment of the threshold voltage can be sped up. Referring to FIG. 5, if an error is produced in the slow page (i.e., in the MSB), according to the conventional technique, all the threshold voltages (7 threshold voltages) need to be adjusted. However, through the method described above, only four threshold voltages (i.e., the threshold voltages $V_{gca}$, $V_{gcc}$, $V_{gce}$, and $V_{gcg}$) are adjusted. If an error is produced in the mid-speed page, two threshold voltages (i.e., the threshold voltages $V_{gcb}$ and $V_{gcf}$) are adjusted. If an error is produced in the fast page, only one threshold voltage (i.e., the threshold voltage $V_{gcd}$) is adjusted.

Through the exemplary embodiments described above, each page of the rewritable non-volatile memory 230 respectively has its corresponding threshold voltages. Thus, the memory controller 220 can adjust the corresponding threshold voltages with respect to each page. Accordingly, the buffer size is reduced and the error bit numbers can be obtained quickly. Additionally, all the word lines of the rewritable non-volatile memory 230 may also have only one threshold voltage such that the memory controller 220 only adjusts the single threshold voltage. However, the present invention is not limited herein.

In summary, according to the present invention, the numbers of error bits corresponding to adjacent two storage states are obtained, and the compensation voltage of a threshold voltage between these two storage states is calculated so as to compensate the threshold voltage appropriately. Thereby, the error in read data is reduced to a correctable error range, and the lifespan of the rewritable non-volatile memory apparatus is prolonged. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of adjusting a threshold voltage, for a rewritable non-volatile memory, the method comprising:
   writing data into the rewritable non-volatile memory;
   reading the data from the rewritable non-volatile memory, wherein the data is at least corresponding to one of a plurality of storage states of the rewritable non-volatile memory, and the storage states respectively represent voltage ranges, and the voltage ranges are distinguished by at least one threshold voltage;
   comparing the read data with the written data to obtain an error bit information;
   calculating a compensation voltage of the threshold voltage according to the error bit information; and
   adjusting the threshold voltage according to the compensation voltage.

2. The method of adjusting the threshold voltage according to claim 1, wherein the rewritable non-volatile memory has a plurality of word lines, and each of the word lines has a plurality of pages,
   wherein before the step of writing the data into the rewritable non-volatile memory, the method further comprises determining whether an error bit number of one of the word lines of the rewritable non-volatile memory is greater than a first predetermined value, and
   wherein the step of writing the data into the rewritable non-volatile memory is executed when the error bit number of one of the word lines of the rewritable non-volatile memory is greater than the first predetermined value.

3. The method of adjusting the threshold voltage according to claim 1, wherein the storage states comprise a first storage state and a second storage state, the voltage ranges of the first storage state and the second storage state are next to each other and are distinguished by the threshold voltage, the data comprises multi bits, and the error bit information comprises error bit numbers of the bits, wherein the step of comparing the read data with the written data to obtain the error bit information comprises:

obtaining a first error bit number by counting the number of the bits that is written in the first storage state and read in the second storage state; and obtaining a second error bit number by counting the number of the bits that is written in the second storage state and read in the first storage state.

4. The method of adjusting the threshold voltage according to claim 3, wherein the step of calculating the compensation voltage of the threshold voltage according to the error bit information comprises:

calculating the compensation voltage of the threshold voltage according to the first error bit number and the second error bit number.

5. The method of adjusting the threshold voltage according to claim 3, wherein the rewritable non-volatile memory comprises at least a fast page and a slow page, and the step of writing the data into the rewritable non-volatile memory comprises:

determining the page having the error bit number greater than a first predetermined value to be the fast page or the slow page.

6. The method of adjusting the threshold voltage according to claim 5, wherein after the step of determining the page having the error bit number greater than the first predetermined value to be the fast page or the slow page, the method comprises:

when the page having the error bit number greater than the first predetermined value is the fast page, reading the corresponding data from error bit positions of the fast page, and obtaining the first error bit number and the second error bit number of the fast page according to the data.

7. The method of adjusting the threshold voltage according to claim 5, wherein after the step of determining the page having the error bit number greater than the first predetermined value to be the fast page or the slow page, the method comprises:

when the page having the error bit number greater than the first predetermined value is the slow page, reading the corresponding data from error bit positions of the slow page;

reading the corresponding data from the fast page according to the error bit positions of the slow page; and obtaining the first error bit number and the second error bit number of the slow page according to the data of the fast page and the data of the slow page.

8. The method of adjusting the threshold voltage according to claim 1, wherein after the step of obtaining the error bit information, the method further comprises:

determining whether the error bit number in the error bit information is greater than a second predetermined value; and when the error bit number is greater than the second predetermined value, executing the step of calculating the compensation voltage of the threshold voltage.

9. A method of calculating a compensation voltage, for a rewritable non-volatile memory, wherein the rewritable non-volatile memory has a plurality of word lines, each of the word lines has a plurality of pages, the rewritable non-volatile memory comprises a plurality of storage states, the storage states comprise at least a first storage state and a second storage state, and the first storage state and the second storage state respectively represent voltage ranges, and the voltage ranges are distinguished by a threshold voltage, the method comprising:

when an error bit number produced by one of the pages is greater than a first predetermined value, locating a plurality of error bit positions in the page having the error bit number greater than the first predetermined value;

reading a plurality of corresponding data from the error bit positions;

obtaining a first error bit number by counting the number of bits that is written in the first storage state and read in the second storage state;

obtaining a second error bit number by counting the number of bits that is written in the second storage state and read in the first storage state; and calculating the compensation voltage according to the first error bit number and the second error bit number.

10. The method of calculating the compensation voltage according to claim 9, wherein the pages comprise a fast page and a slow page, and when the error bit number produced by one of the pages is greater than the first predetermined value, the method further comprises:

determining the page having the error bit number greater than the first predetermined value to be the fast page or the slow page.

11. The method of calculating the compensation voltage according to claim 10, wherein after the step of determining the page having the error bit number greater than the first predetermined value to be the fast page or the slow page, the method comprises:

when the page having the error bit number greater than the first predetermined value is the fast page, reading the corresponding data from the error bit positions of the fast page, and obtaining the first error bit number and the second error bit number of the fast page according to the data.

12. The method of calculating the compensation voltage according to claim 10, wherein after the step of determining the page having the error bit number greater than the first predetermined value to be the fast page or the slow page, the method comprises:

when the page having the error bit number greater than the first predetermined value is the slow page, reading the corresponding data from the error bit positions of the slow page;

reading the corresponding data from the fast page according to the error bit positions of the slow page; and obtaining the first error bit number and the second error bit number of the slow page according to the data of the slow page and the data of the fast page.

13. The method of calculating the compensation voltage according to claim 9, wherein the voltage range of the first storage state is smaller than the voltage range of the second storage state, and the compensation voltage is calculated based on following formula:

$$x = g \times \log_2\left(\frac{error2}{error1}\right);$$

wherein x represents the compensation voltage, g is a constant, error2 represents the second error bit number, and error1 represents the first error bit number.

14. A rewritable non-volatile memory apparatus, comprising:
   a rewritable non-volatile memory;
   a connector, for receiving data; and
   a memory controller, coupled to the rewritable non-volatile memory and the connector, for executing at least following steps:
   writing the data into the rewritable non-volatile memory;
   reading the data from the rewritable non-volatile memory, wherein the data is at least corresponding to one of a plurality of storage states of the rewritable non-volatile memory, and the storage states respectively represent voltage ranges, and the voltage ranges are distinguished by at least one threshold voltage;
   comparing the read data with the written data to obtain an error bit information;
   calculating a compensation voltage of the threshold voltage according to the error bit information; and
   adjusting the threshold voltage according to the compensation voltage.

15. The rewritable non-volatile memory apparatus according to claim 14, wherein the rewritable non-volatile memory has a plurality of word lines, each of the word lines has a plurality of pages, and the memory controller further executes following steps:
   determining whether an error bit number produced by one of the word lines of the rewritable non-volatile memory is greater than a first predetermined value, and
   when the error bit number produced by one of the word lines of the rewritable non-volatile memory is greater than the first predetermined value, writing the data into the rewritable non-volatile memory.

16. The rewritable non-volatile memory apparatus according to claim 15, wherein the storage states comprise a first storage state and a second storage state, the voltage ranges of the first storage state and the second storage state are next to each other and distinguished by the threshold voltage, the data comprise multi bits, the error bit information comprise error bit numbers of the bits, and the memory controller further executes following steps:
   obtaining a first error bit number by counting the number of the bits that is written in the first storage state and read in the second storage state;
   obtaining a second error bit number by counting the number of the bits that is written in the second storage state and read in the first storage state; and
   calculating the compensation voltage of the threshold voltage according to the first error bit number and the second error bit number.

17. A memory controller, for managing a rewritable non-volatile memory, wherein the rewritable non-volatile memory has a plurality of physical blocks, each of the physical blocks has a plurality of pages, and the pages corresponding to the same physical block are written individually and erased all together, the memory controller comprising:
   a memory management circuit;
   a memory interface, coupled to the memory management circuit, for coupling to the rewritable non-volatile memory; and
   a host interface, coupled to the memory management circuit, for receiving data;
   wherein the memory management circuit executes at least following steps:
   writing the data into the rewritable non-volatile memory;
   reading the data from the rewritable non-volatile memory, wherein the data is at least corresponding to one of a plurality of storage states of the rewritable non-volatile memory, and the storage states respectively represent voltage ranges, and the voltage ranges are distinguished by at least one threshold voltage;
   comparing the read data with the written data to obtain an error bit information;
   calculating a compensation voltage of the threshold voltage according to the error bit information; and
   adjusting the threshold voltage according to the compensation voltage.

18. The memory controller according to claim 17, wherein the memory management circuit further executes following steps:
   determining whether an error bit number produced by one of the pages of the rewritable non-volatile memory is greater than a first predetermined value; and
   when the error bit number produced by one of the pages of the rewritable non-volatile memory is greater than the first predetermined value, writing the data into the rewritable non-volatile memory.

19. The memory controller according to claim 18, wherein the storage states comprise a first storage state and a second storage state, the voltage ranges of the first storage state and the second storage state are next to each other and distinguished by the threshold voltage, the data comprises multi bits, the error bit information comprises error bit numbers of the bits, and the memory management circuit further executes following steps:
   obtaining a first error bit number by counting the number of the bits that is written in the first storage state and read in the second storage state;
   obtaining a second error bit number by counting the number of the bits that is written in the second storage state and read in the first storage state; and
   calculating the compensation voltage of the threshold voltage according to the first error bit number and the second error bit number.

20. The memory controller according to claim 19, wherein the pages comprise at least a fast page and a slow page, and the memory management circuit further executes following steps:
   determining the page having the error bit number greater than the first predetermined value to be the fast page or the slow page.

21. The memory controller according to claim 20, wherein the memory management circuit further executes following steps:
   when the page having the error bit number greater than the first predetermined value is the fast page, reading the corresponding data from error bit positions of the fast page; and
   obtaining the first error bit number and the second error bit number of the fast page according to the data.

22. The memory controller according to claim 20, wherein the memory management circuit further executes following steps:
   when the page having the error bit number greater than the first predetermined value is the slow page, reading the corresponding data from error bit positions of the slow page; and reading the corresponding data from the fast page according to the error bit positions of the slow page; and obtaining the first error bit number and the second error bit number of the slow page according to the data of the slow page and the data of the fast page.

23. The memory controller according to claim 19, wherein the voltage range of the first storage state is smaller than the voltage range of the second storage state, and the memory management circuit calculates the compensation voltage based on following formula:

$$x = g \times \log_2\left(\frac{error2}{error1}\right);$$

wherein x represents the compensation voltage, g is a constant, error2 represents the second error bit number, and error1 represents the first error bit number.

* * * * *